United States Patent
M'Saad et al.

(10) Patent No.: US 6,399,489 B1
(45) Date of Patent: Jun. 4, 2002

(54) BARRIER LAYER DEPOSITION USING HDP-CVD

(75) Inventors: Hichem M'Saad; Seon Mee Cho, both of Santa Clara; Dana Tribula, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/431,411

(22) Filed: Nov. 1, 1999

(51) Int. Cl.$^7$ ............................................. K01L 21/44
(52) U.S. Cl. ...................... 438/680; 438/758; 438/761; 438/778; 438/792; 438/793; 438/479; 438/931
(58) Field of Search .................. 438/680, 758, 438/761, 778, 792, 793, 479, 931

(56) References Cited

U.S. PATENT DOCUMENTS

| | | | |
|---|---|---|---|
| 4,555,464 A | * 11/1985 | Kido et al. | 430/67 |
| 4,557,946 A | 12/1985 | Sacher et al. | 427/41 |
| 4,789,648 A | 12/1988 | Chow et al. | 437/225 |
| 4,798,629 A | 1/1989 | Wood et al. | 106/287.16 |
| 4,812,325 A | 3/1989 | Ishihara et al. | 427/69 |

(List continued on next page.)

FOREIGN PATENT DOCUMENTS

| | | | |
|---|---|---|---|
| DE | 19654737 A1 | 7/1997 | |
| EP | 0469926 A1 | 2/1991 | |
| EP | 0519079 A1 | 12/1992 | |
| EP | 0522799 A2 | 1/1993 | |
| EP | 0 725 440 | 1/1996 | ......... H01L/23/532 |
| EP | 0711817 A2 | 5/1996 | |
| EP | 0721019 A2 | 7/1996 | |
| EP | 0721019 A3 | 7/1996 | |
| EP | 0743675 A1 | 11/1996 | |
| EP | 0774533 A1 | 5/1997 | |
| EP | 0885983 A1 | 12/1998 | |

(List continued on next page.)

OTHER PUBLICATIONS

C.Y. Chang and S.M. Sze, ULSI Technology, 1996, McGraw–Hill, pp. 444–445.*

Xu et al., "BLOK—A Low–K Dielectric Barrier/Etch Stop Film for Copper Damascene Applications," IITC 99–109, 1999 IEEE.

Laboda, et al., "Plasma–enhanced chemical vapor deposition of a SIC:H films from organosilicon precursors," 8257A Journal of Vacuum Science & Technology, Jan./Feb. 1994, pp. 90–96.

(List continued on next page.)

Primary Examiner—Matthew Smith
Assistant Examiner—Victor Yevsikor
(74) Attorney, Agent, or Firm—Townsend and Townsend and Crew

(57) ABSTRACT

A method of depositing a film, such as a barrier layer, on a substrate using a gaseous mixture including a hydrocarbon-containing gas and a silicon-containing gas. Suitable hydrocarbon-containing gases include alkanes such as methane ($CH_4$), ethane ($C_2H_6$), butane ($C_3H_8$), propane ($C_4H_{10}$), etc. Suitable silicon-containing gases include silanes such as monosilane ($SiH_4$). The method generally comprises providing a suitable gaseous mixture to the chamber, generating a plasma from the gaseous mixture, and depositing a film onto the substrate using the plasma. In a preferred embodiment, the film is deposited in a high-density plasma chemical vapor deposition (HDP-CVD) system. The gaseous mixture typically includes a silicon containing gas, such as an alkane, and a hydrocarbon containing gas, such as a silane. Embodiments of the method of the present invention can integrated stack structures having overall dielectric constant of about 4.0 or less. Such a structure may include a barrier layer having a dielectric constant of 4.5 or less.

25 Claims, 10 Drawing Sheets

U.S. PATENT DOCUMENTS

| | | | |
|---|---|---|---|
| 4,828,880 A | 5/1989 | Jenkins et al. | 427/167 |
| 4,845,054 A | 7/1989 | Mitchener | 437/238 |
| 4,894,352 A | 1/1990 | Lane et al. | 437/238 |
| 4,900,591 A | 2/1990 | Bennett et al. | 427/255 |
| 4,973,511 A | 11/1990 | Farmer et al. | 428/216 |
| 4,981,724 A | 1/1991 | Hochberg et al. | 427/255 |
| 5,028,566 A | 7/1991 | Lagendijk | 437/238 |
| 5,040,046 A | 8/1991 | Chhabra et al. | 357/54 |
| 5,120,680 A | 6/1992 | Foo et al. | 437/238 |
| 5,124,014 A | 6/1992 | Foo et al. | 204/192.32 |
| 5,204,141 A | 4/1993 | Roberts et al. | 427/255.3 |
| 5,224,441 A | 7/1993 | Felts et al. | 118/718 |
| 5,246,887 A | 9/1993 | Yu | 437/238 |
| 5,250,473 A | 10/1993 | Smits | 437/238 |
| 5,279,867 A | 1/1994 | Friedt et al. | 427/583 |
| 5,314,724 A | 5/1994 | Tsukune et al. | 427/489 |
| 5,352,493 A | 10/1994 | Dorfman et al. | 427/530 |
| 5,362,526 A | 11/1994 | Wang et al. | 427/573 |
| 5,364,666 A | 11/1994 | Williams et al. | 427/579 |
| 5,465,680 A | 11/1995 | Loboda | 117/84 |
| 5,466,431 A | 11/1995 | Dorfman et al. | 423/446 |
| 5,468,520 A | 11/1995 | Williams et al. | 427/560 |
| 5,494,712 A | 2/1996 | Hu et al. | 427/489 |
| 5,508,368 A | 4/1996 | Knapp et al. | 427/534 |
| 5,554,570 A | 9/1996 | Maeda et al. | 437/235 |
| 5,563,105 A | 10/1996 | Dobuzinsky et al. | 437/240 |
| 5,578,523 A | 11/1996 | Fiordalice et al. | 437/190 |
| 5,593,740 A | 1/1997 | Ikeda | 427/579 |
| 5,598,027 A | 1/1997 | Matsuura | 257/635 |
| 5,616,369 A | 4/1997 | Williams et al. | |
| 5,618,619 A | 4/1997 | Petrmichl et al. | 428/334 |
| 5,637,351 A | 6/1997 | O'Neal et al. | 427/255.3 |
| 5,638,251 A | 6/1997 | Goel et al. | 361/313 |
| 5,661,093 A * | 8/1997 | Ravi et al. | 438/763 |
| 5,683,940 A | 11/1997 | Yahiro | 437/195 |
| 5,693,563 A | 12/1997 | Teong | 437/190 |
| 5,700,720 A | 12/1997 | Hashimoto | 437/195 |
| 5,703,404 A | 12/1997 | Matsuuro | 257/758 |
| 5,739,579 A | 4/1998 | Chiang et al. | 257/635 |
| 5,750,210 A * | 5/1998 | Schmidt et al. | |
| 5,753,564 A | 5/1998 | Fukada | 437/238 |
| 5,789,319 A | 8/1998 | Havemann et al. | 438/668 |
| 5,800,878 A * | 9/1998 | Yao | 427/573 |
| 5,807,785 A | 9/1998 | Ravi | 438/624 |
| 5,821,168 A | 10/1998 | Jain | 438/692 |
| 5,834,162 A | 11/1998 | Malba | 430/317 |
| 5,858,880 A | 1/1999 | Dobson et al. | 438/758 |
| 5,888,593 A | 3/1999 | Petrmichl et al. | 427/563 |
| 5,891,799 A | 4/1999 | Tsui | 438/624 |
| 6,051,321 A * | 4/2000 | Lee et al. | 428/447 |
| 6,251,770 B1 * | 6/2001 | Uglow et al. | 438/624 |

FOREIGN PATENT DOCUMENTS

| | | |
|---|---|---|
| JP | SHO59-98726 | 6/1984 |
| JP | 60111480 | 6/1985 |
| JP | 01050429 | 2/1989 |
| JP | 05267480 | 10/1993 |
| JP | 6-163521 | 6/1994 |
| JP | 6-168937 | 6/1994 |
| JP | 8-222559 | 8/1996 |
| JP | 8-236518 | 9/1996 |
| JP | 8-288286 | 11/1996 |
| JP | 9-8031 | 1/1997 |
| JP | 9-237785 | 9/1997 |
| WO | WO92/12535 | 7/1992 |
| WO | WO94/01885 | 1/1994 |
| WO | WO98/08249 | 2/1998 |
| WO | WO98/59089 | 12/1998 |
| WO | WO 99/33102 | 1/1999 |

OTHER PUBLICATIONS

Giorgis et al., "a SiC:H films deposited by PECVD from silane+acetylene and silane+acetueme+hydrogen gas mixture," Elsevier, Diamond and Related Materials 6 (1997) pp. 1601–1611.

C.D. Dobson, A Kiermasz, K. Beekman, R.J. Wilby, "Advanced $SiO_2$ Planarization Using Silane and $H_2O_2$," Dec. 1994, pp. 85–87.

L.C. Feldman, Murray Hill, and W.F. van der Weg, "applied surface science," vol. 43 (1989), pp. 301–303.

"Journal of Vacuum Science & Technology A Vacuum, Surfaces, and Films," J. Vac. Sci. Technol. A, vol. 13, No. 2, Mar./Apr. 1995, pp. 475–480.

M. Matsuura, Y. Hayashide, H. Kotani, T. Nishimura, H. Iuchi, C.D. Dobson, A Kiermasz, K. Beekmann and R. Wilby, "Novel Sel–planarizing CVD Oxide for Interlayer Dielectric Applications,"1994, pp. 5.7.1–5.7.4.

Frédéric Gaillard, Pascal Brault, and Pierre Brouquet "Silicon dioxide chemical vapor deposition using silane and hydrogen peroxide," J. Vac. Sci. Technol. Ju./Aug. 1995, pp. 2767–2769.

\* cited by examiner

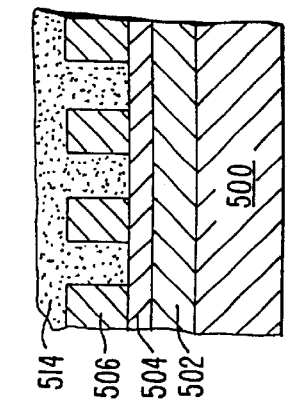
FIG. 5(a).
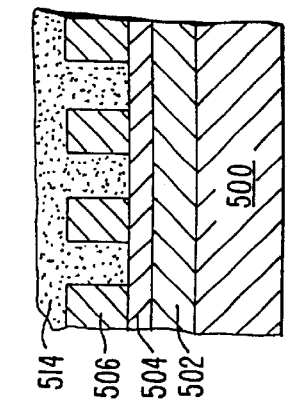
FIG. 5(b).
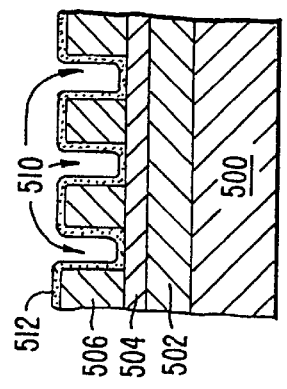
FIG. 5(c).
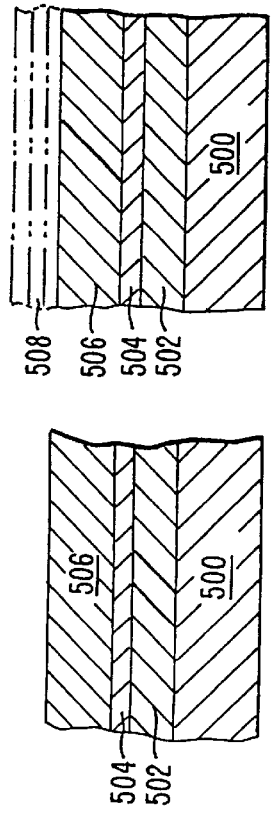
FIG. 5(d).
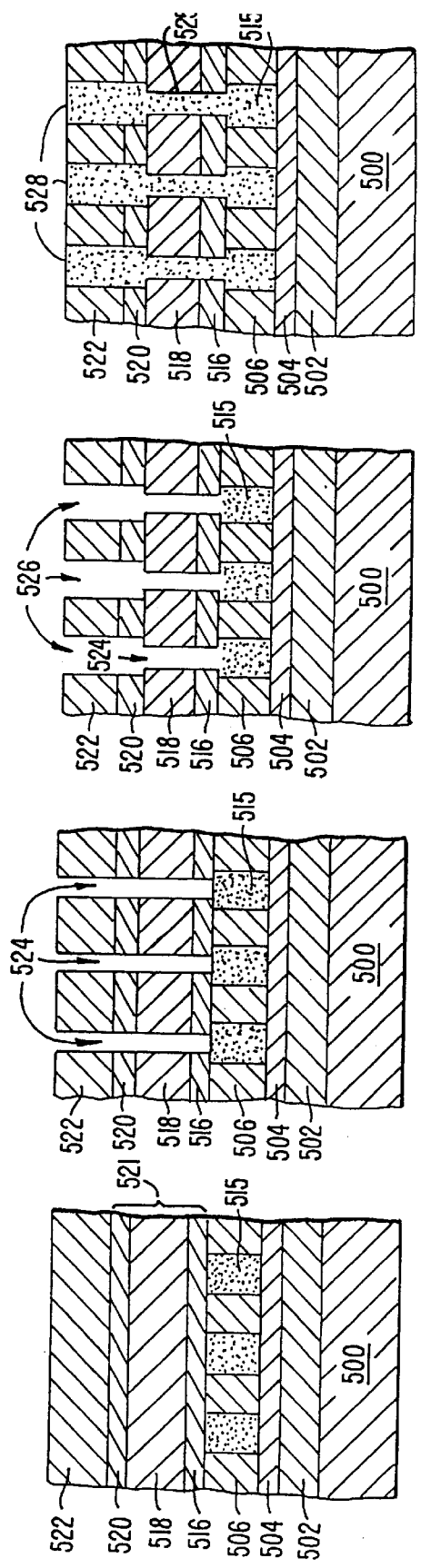
FIG. 5(e).
FIG. 5(f).
FIG. 5(g).
FIG. 5(h).

BARRIER LAYER DEPOSITION USING HDP-CVD

BACKGROUND OF THE INVENTION

The present invention relates to the manufacture of integrated circuits, and more specifically, to a method of formation of a barrier layer for dual damascene processes.

In conventional integrated circuit fabrication, circuit elements are formed by etching a pattern of gaps in a layer of metal such as aluminum. The gaps are then filled with a dielectric such as silicon dioxide. Copper is poised to take over as the main on-chip conductor for all types of integrated circuits due to its lower resistance as compared to conventional aluminum alloys. Unfortunately it is difficult to etch copper and therefore, damascene processes have developed for fabrication of copper-based integrated circuits. In damascene processes, dielectric layers are deposited to form an integrated stack and then etched to form gaps that are subsequently filled with copper.

HDP-CVD fluorine-doped silicon oxide, also known as fluorosilicate glass (FSG) is an attractive solution to replace conventional silicon dioxide as intermetal dielectrics for damascene structures. FSG can be deposited in a conventional HDP-CVD systems which have been widely used for undoped silicate glass (USG) and FSG dielectrics in Aluminum interconnects. FSG has a good process scheme in terms of reliability, stability and throughput. The electrical performance of integrated circuits can be significantly improved due to the lower dielectric constant of FSG (about 3.3–3.6 compared to about 4.1–4.3 for conventional silicon oxides). The lower dielectric constant reduces the capacitance between metal lines in the same layer and reduces cross talk across layers.

The dielectric layers that separate layers of copper in a damascene structure are often referred to as intermetal dielectric (IMD) layers. IMD layers typically include a barrier layer to prevent diffusion of copper into adjacent dielectric layers such as FSG. Some integrated stacks used in damascene processes also utilize a layer known as an etch stop or hardmask to provide for selective etching of the film. Silicon nitride ($Si_xN_y$) is commonly used as a barrier layer or etch stop in damascene applications, for example when forming vias between layers containing metal lines. Unfortunately, silicon nitride has a relatively high dielectric constant $k \approx 7.0$ to 7.5 compared to 4.0–4.2 for silicon oxide or 3.3–3.6 for FSG, k. Consequently a dielectric layer containing silicon nitride will have an undesirably high fringe capacitance.

Generally, the thicker the layer of silicon nitride, compared to the FSG thickness, the larger the overall dielectric constant for the integrated stack. The effective dielectric constant of an integrated stack depends on the thickness and dielectric constant of each layer comprising the integrated stack. The dielectric constant of the overall film can be reduced either by reducing the thickness of the barrier layer or by using a barrier layer material with a lower dielectric constant. Present deposition processes can deposit suitable $Si_xN_y$ films as thin as a few hundred angstroms in thickness or more. Existing techniques generally cannot deposit thinner films while maintaining the desired uniformity and overall film quality. Silicon-carbon-hydrogen based low-k barrier layers have been developed such as BLOK™ (Barrier Low K). BLOK™ is a trademark of Applied Materials, Inc. of Santa Clara, Calif. Such low-k barrier layers are typically deposited by plasma enhanced chemical vapor deposition (PECVD) using trimethylsilane (TMS). BLOK deposited using TMS provides capping solutions suitable for numerous processes, however alternative applications are desirable to enhance process integration.

Therefore, a need exists in the art for an inexpensive method of depositing an integrated stack including a low dielectric constant barrier layer that can be readily integrated with dielectric layer deposition.

SUMMARY OF THE INVENTION

The disadvantages associated with the prior art are overcome by a method of depositing a film, such as a barrier layer, on a substrate using a gaseous mixture that includes a silicon containing gas, and a hydrocarbon gas. The method generally comprises providing the gaseous mixture to the chamber, generating a plasma from the gaseous mixture, and depositing a film onto the substrate using the plasma. Suitable hydrocarbon gases include alkanes having the general formula $C_xH_{2x+2}$. Suitable alkanes include methane ($CH_4$), ethane ($C_2H_6$), butane ($C_3H_8$), propane ($C_4H_{10}$), etc. Suitable silicon containing gases include silanes having the general formula $Si_yH_{2y+2}$. The gaseous mixture may optionally include a flow of argon (Ar) to promote gas dissociation. In a preferred embodiment, the plasma is a high-density plasma. Preferably, the gaseous mixture has a carbon:silicon ratio of greater than 1:1, more preferably, between about 3:1 and 8:1. The resulting film has a C:Si ratio ranging from 55:45 to 65:35. Embodiments of the method of the present invention can deposit integrated stacks having an overall dielectric constant of about 4.0 or less. Such a stack may include a barrier layer having a dielectric constant of 3.0 or less. Integrated stacks and barrier layers deposited according to the present invention may be used in intermetal dielectric layers for dual damascene structures.

The method of the present invention may be embodied in a computer readable storage medium having a computer-readable program embodied therein for directing operation of a substrate processing system. Such a system may include a process chamber; a plasma generation system; a substrate holder; and a gas delivery system configured to introduce gases into the process chamber. The computer-readable program includes instructions for operating the substrate processing system to form a film on a substrate disposed in the processing chamber in accordance with embodiments of the above method.

These and other embodiments of the present invention, as well as its advantages and features are described in more detail in conjunction with the text below and attached figures.

BRIEF DESCRIPTION OF THE DRAWINGS

FIGS. 5(a)–5(h) depict a cross-section of a partially formed integrated circuit undergoing an integrated dual-damascene process according to an embodiment of the present invention;

DESCRIPTION OF THE SPECIFIC EMBODIMENTS

I. Introduction

Figure 1A:
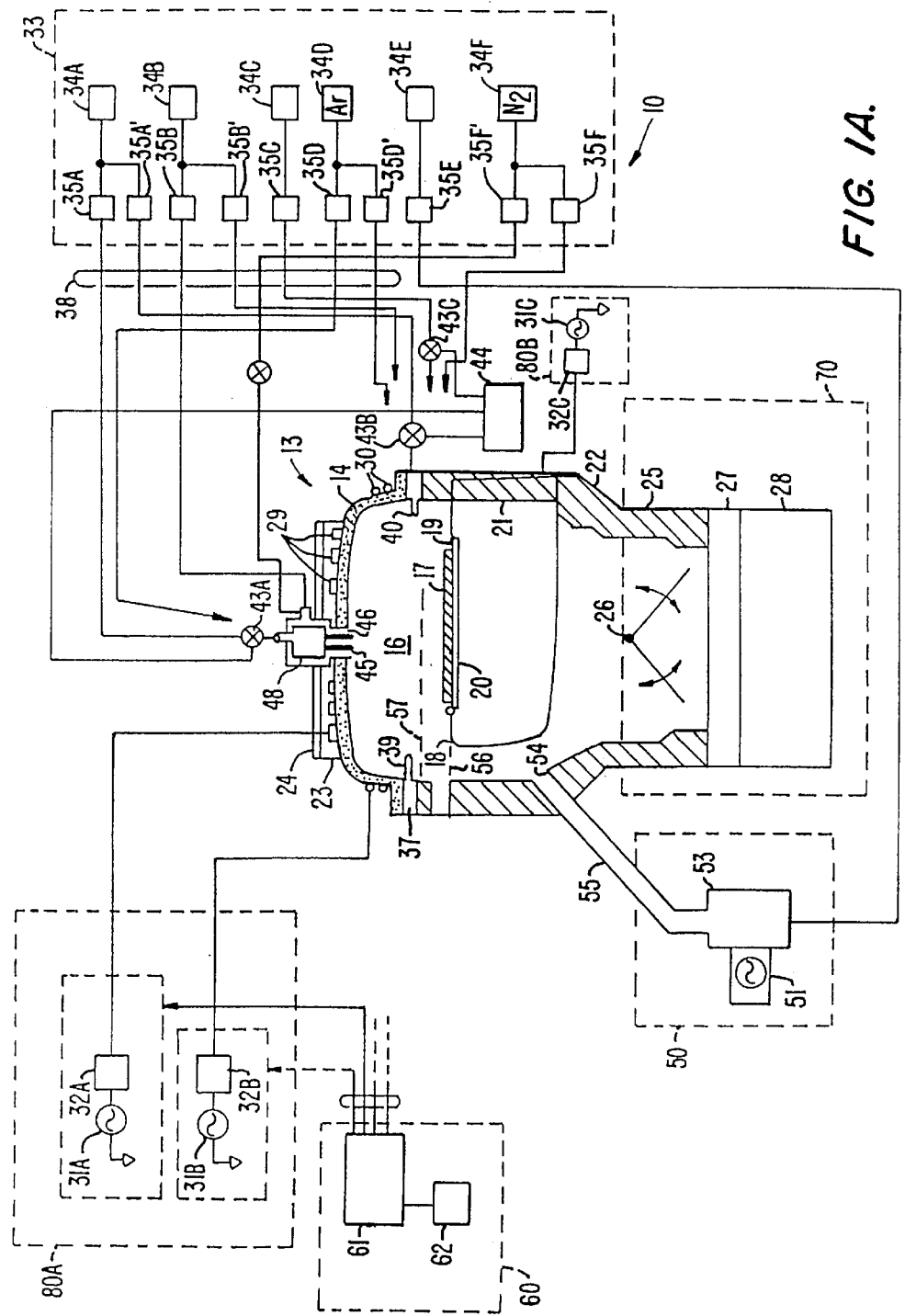
FIG. 1A is a simplified diagram of one embodiment of a high density chemical vapor deposition system according to the present invention.

The present invention deposits a low-k barrier layer in a plasma CVD process using gaseous mixture including a hydrocarbon gas and a silicon containing gas. The gaseous mixture may also include an inert gas, such as argon (Ar), to promote gas dissociation. Hydrocarbon gases generally contain only carbon (C) and hydrogen (H) in a formula of type $C_xH_m$, where x and m are integers. Such hydrocarbon compounds include alkanes having the general formula $C_xH_{2x+2}$. Typical alkanes include methane $CH_4$), ethane $(C_2H_6)$, butane $(C_3H_8)$, propane $(C_4H_{10})$, pentane, $(C_5H_{12})$ hexane $(C_6H_{14})$, etc. These compounds are inexpensive, readily available at high purity (e.g. electronic or CMOS grade), non-proprietary, and are normally gases at ambient temperature and pressure. Alternatively other hydrocarbons including alkenes or alkynes such as acetylene $(C_2H_2)$ may be used as the hydrocarbon containing gas. The term hydrocarbon herein also includes all isomers of the various alkanes, alkenes, alkynes and other hydrocarbons. Additionally, the hydrocarbon containing gas may be a mixture containing two or more different types of hydrocarbon compounds.

In the present method, the silicon containing gas is generally hydride of silicon having the general formula $Si_yH_m$, where y and m are integers. Hydrides of silicon include silanes having the general formula $Si_yH_{2y+2}$. Such silanes include monosilane $(SiH_4)$, disilane $(Si_2H_6)$, trisilane $(Si_3H_8)$, and tetrasilane $(Si_4H_{10})$. Alternative silicon containing gases include halides of silicon such as silicon tetrafluoride $(SiF_4)$, and silazanes. The silicon containing gas may also be a mixture containing two or more different types of hydrides of silicon or other silicon compounds.

In the plasma, the hydrocarbon containing and silicon containing gases are dissociated and react to form a Si—C—H low-k barrier layer on a surface of the substrate. In one particular embodiment, the plasma is a high-density plasma (HDP), which readily dissociates the reactant gases. HDP-CVD processes are desirable for barrier layer deposition when forming integrated stacks including an intermetal dielectric (IMD) layer since HDP-CVD can deposit other layers of the stack such as FSG. HDP-CVD deposition of both the low-k barrier layer and the FSG enhances process integration since a low-k barrier layer typically lies on top of or underneath an FSG layer in the stack.

The dielectric constant and other properties of the barrier layer depend on the relative content of carbon in the barrier layer. Generally, the higher the carbon content in the film the lower the k-value. As described below, suitable adjustment of the ratio of carbon to silicon in the gaseous mixture controls the carbon content of the deposited film. Preferably, the atomic ratio of carbon to silicon (C:Si ratio) is between 55:45 and 65:35.

Furthermore, it is generally desirable to have a relatively low hydrogen content, preferably less than 50%, in the resulting Si—C—H film. For example, Si—C—H films such as BLOK, which are deposited using TMS, typically contain about 45% atomic hydrogen. This is not surprising since TMS contains 3 hydrogen atoms for each carbon atom. In certain applications, a large hydrogen content in a barrier layer may lead to undesirable leakage currents. In some applications it is desirable to control the content of hydrogen in the gaseous mixture. In the present method, the amount of hydrogen can be reduced, for example, by using a hydrocarbon having fewer hydrogen atoms per carbon atom. For example methane $CH_4$) has four hydrogen atoms per carbon atom while ethane $(C_2H_6)$ has three hydrogen atoms per carbon atom. Alternatively, acetylene $(C_2H_2)$ has only one carbon atom per hydrogen atom. The silicon containing gas may be similarly chosen to have fewer hydrogen atoms per silicon atom.

II. Exemplary Substrate Processing System

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than,for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 Torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at between 1.8 and 2.2 MHz nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. BRF generator 31C provides RF power at a frequency ranging from about 1–100. In a specific embodiment, BRF generator 31C provides up to 5,000 watts of RF power at 13.56 MHz.

RF generators 31A and 31B include digitally controlled synthesizers and operate over a frequency range between about 1.8 to about 2.2 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
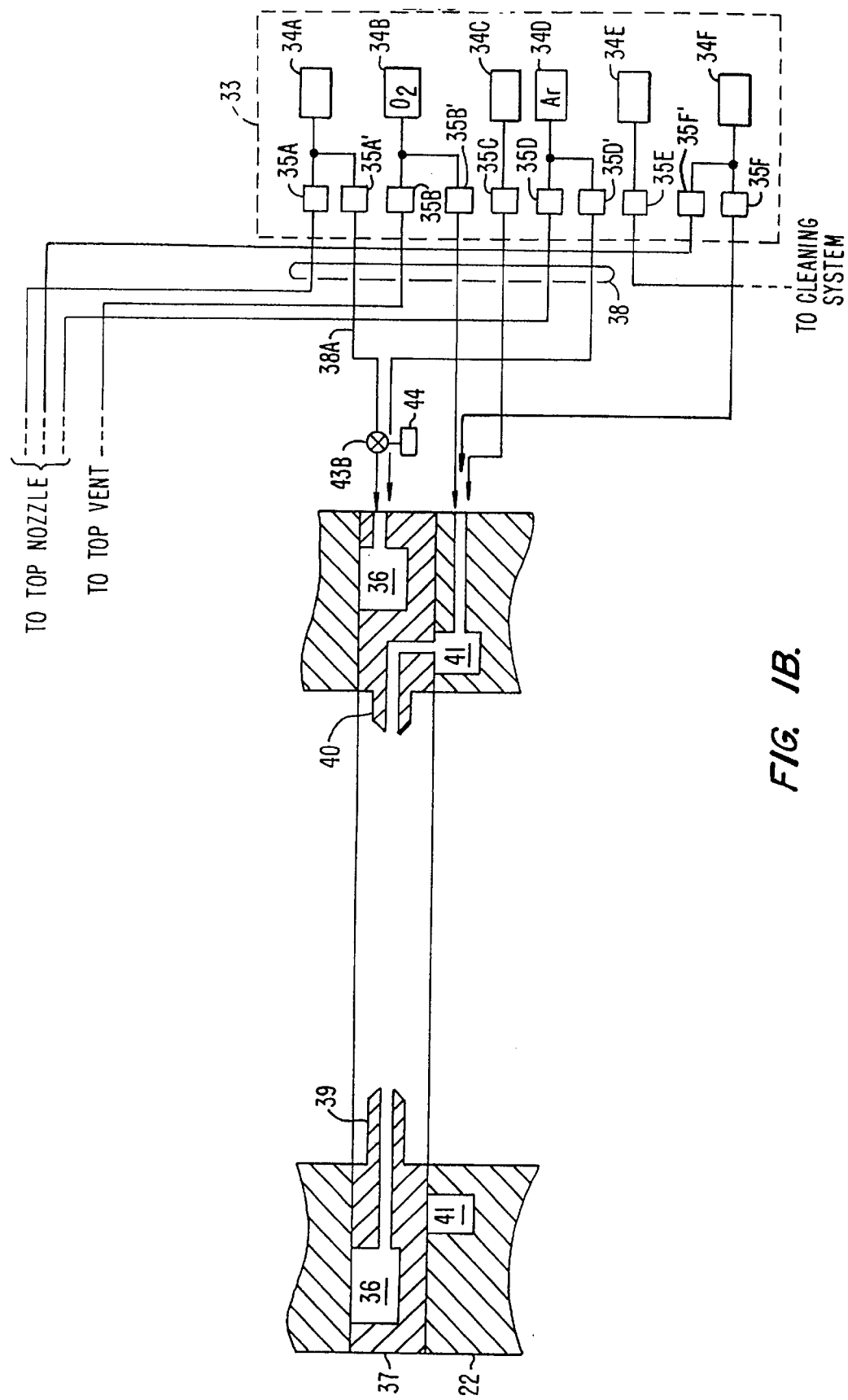
FIG. 1B is a simplified cross section of a gas ring that may be used in conjunction with the exemplary CVD processing chamber of FIG. 1A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of first source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of second source gas nozzles 40 (only one of which is shown), which in a preferred embodiment are co-planar with and shorter than first source gas nozzles 39, and in one embodiment receive gas from body plenum 41. In some embodiments it is desirable not to mix different types of source gases before injecting the gases into chamber 13. In other embodiments, and source gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. The nitrogen source 34F provides nitrogen gas ($N_2$) to the second source gas nozzles 40 of the gas ring to the chamber for process steps utilizing nitrogen plasma. Alternatively, the nitrogen gas could be delivered to the chamber through other or additional inlets, such as the top nozzle 45 via gas flow controller 35F'. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of gas to both top vent 46 and second source gas nozzles 40 from a single source, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube (CRT) 65, and a light pen 66, as depicted in FIG. 1C.

Figure 1C:
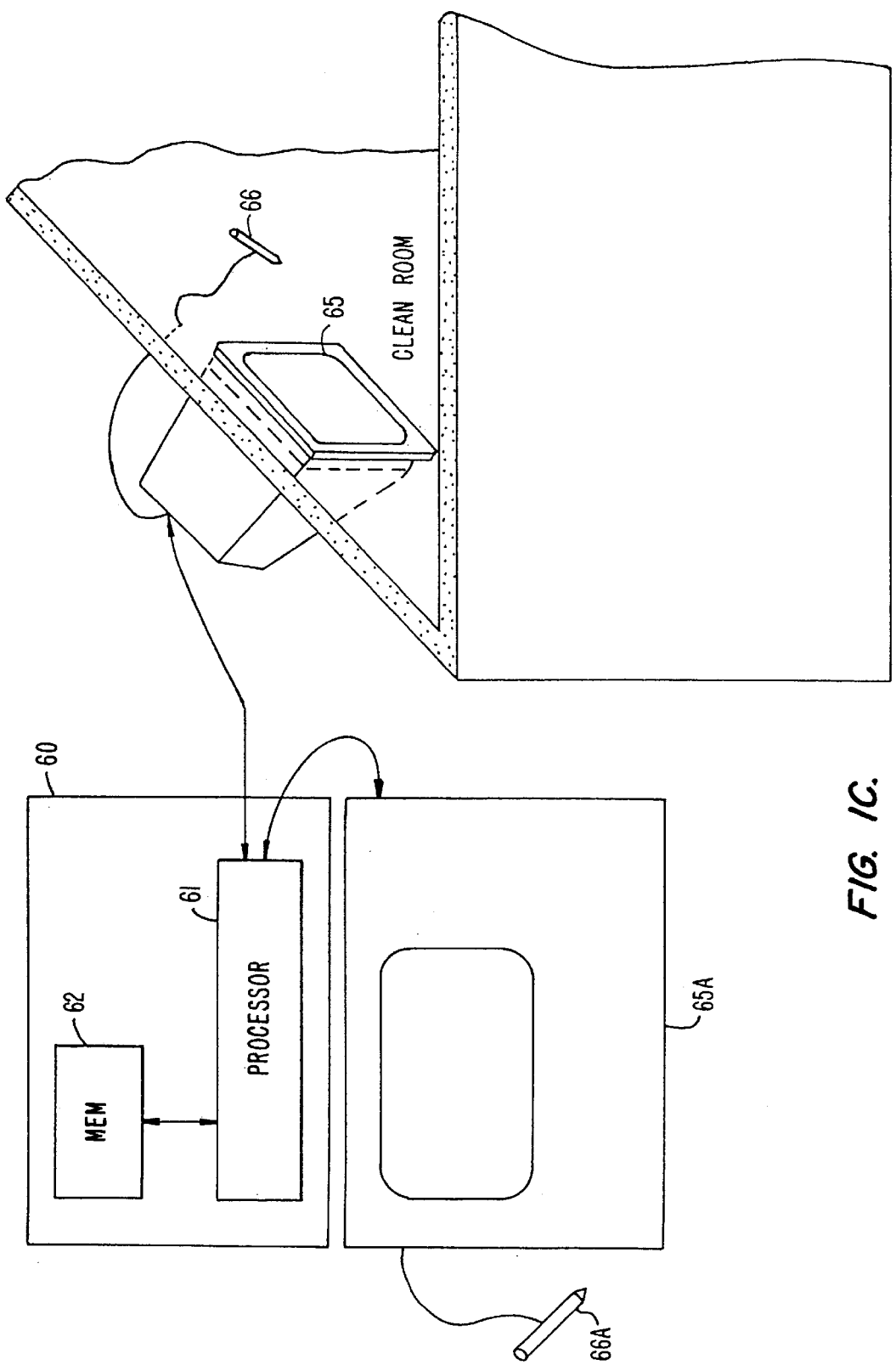
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The area touched confirms being selected by the light pen by changing its color or displaying a new menu, for example.

The computer program code can be written in any conventional computer-readable programming language such as 68000 assembly language, C, C++, FORTRAN, Pascal or other language. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
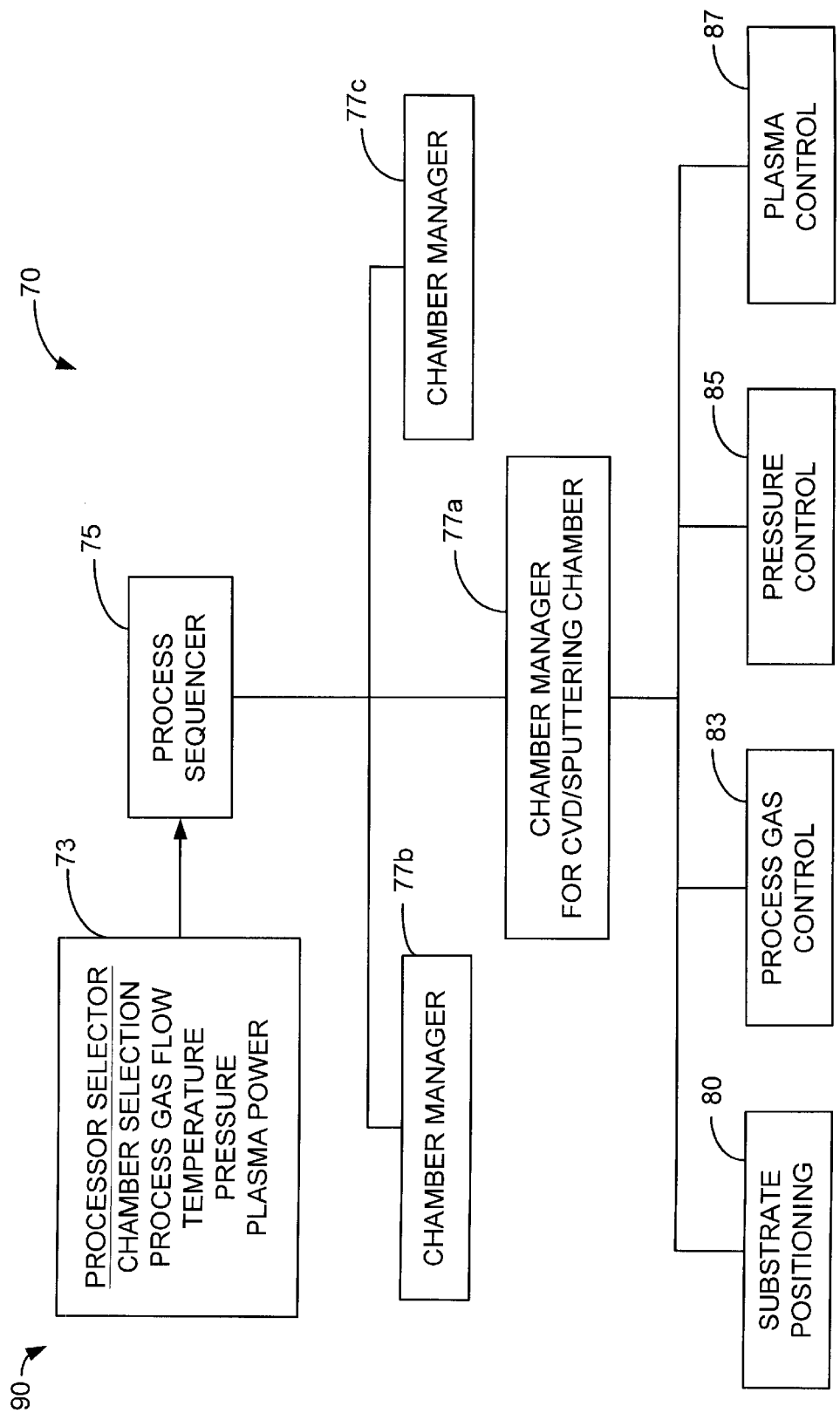
FIG. 1D is a flow chart of an exemplary process control computer program product used to control the exemplary CVD processing chamber of FIG. 1A.

FIG. 1D shows an illustrative block diagram of the hierarchical control structure of computer program 90. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. Process selector subroutine 73 identifies (i) the desired process chamber in a multichamber system, and (ii) the desired set of process parameters needed to operate the process chamber for performing the desired process. The process parameters for performing a specific process relate to conditions such as process gas composition and flow rates, substrate temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 75 comprises program code for accepting the identified process chamber and set of process parameters from the process selector subroutine 73 and for controlling operation of the various process chambers. Multiple users can enter process set numbers and process chamber numbers, or a single user can enter multiple process set numbers and process chamber numbers; sequencer subroutine 75 schedules the selected processes in the desired sequence. Preferably, sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 can be designed to take into consideration the "age of each particular user-entered request, or the present condition of the process chamber being used in comparison with the desired process conditions for a selected process, or any other relevant factor a system programmer desires to include for determining scheduling priorities.

After sequencer subroutine 75 determines which process chamber and process set combination is going to be executed next, sequencer subroutine 75 initiates execution of the process set by passing the particular process set parameters to a chamber manager subroutine 77a–c, which controls multiple processing tasks in chamber 13 and possibly other chambers (not shown) according to the process set sent by sequencer subroutine 75.

Examples of chamber component subroutines are substrate positioning subroutine 80, process gas control subroutine 83, pressure control subroutine 85, and plasma control subroutine 87. Those having ordinary skill in the art will recognize that other chamber control subroutines can be included depending on what processes are selected to be performed in chamber 13. In operation, chamber manager subroutine 77a selectively schedules or calls the process component subroutines in accordance with the particular process set being executed. Chamber manager subroutine 77a schedules process component subroutines in the same manner that sequencer subroutine 75 schedules the process chamber and process set to execute. Typically, chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a PECVD reactor or other reactor in the multi-chamber system, after other processing has been completed.

Process gas control subroutine 83 has program code for controlling process gas composition and flow rates. Subroutine 83 controls the open/close position of the safety shut-off valves and also ramps up/ramps down the mass flow controllers to obtain the desired gas flow rates. All chamber component subroutines, including process gas control subroutine 83, are invoked by chamber manager subroutine 77a. Subroutine 83 receives process parameters from chamber manager subroutine 77a related to the desired gas flow rates.

Typically, process gas control subroutine 83 opens the gas supply lines, and repeatedly (i) reads the necessary mass flow controllers, (ii) compares the readings to the desired flow rates received from chamber manager subroutine 77a, and (iii) adjusts the flow rates of the gas supply lines as necessary. Furthermore, process gas control subroutine 83 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 83 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 83 may include steps for bubbling a delivery gas such as helium through the liquid precursor in a bubbler assembly or for introducing the helium to a liquid injection valve. For this type of process, the process gas control subroutine 83 regulates the flow of the delivery gas, the pressure in the bubbler, and the bubbler temperature to obtain the desired process gas flow rates. As discussed above, the desired process gas flow rates are transferred to process gas control subroutine 83 as process parameters.

Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 83 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 85 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 85, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 85 is invoked, the desired, or target, pressure level is received as a parameter from chamber manager subroutine 77a. Pressure control subroutine 85 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 85 may open or close throttle valve 26 to a particular opening size to regulate the pressure in chamber 13 to a desired pressure or pressure range.

Plasma control subroutine 87 comprises program code for controlling the frequency and power output setting of RF generators 31A and 31B and for tuning matching networks 32A and 32B. Plasma control subroutine 87, like the previously described chamber component subroutines, is invoked by chamber manager subroutine 77a.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

III. Exemplary Structures

Figure 2:
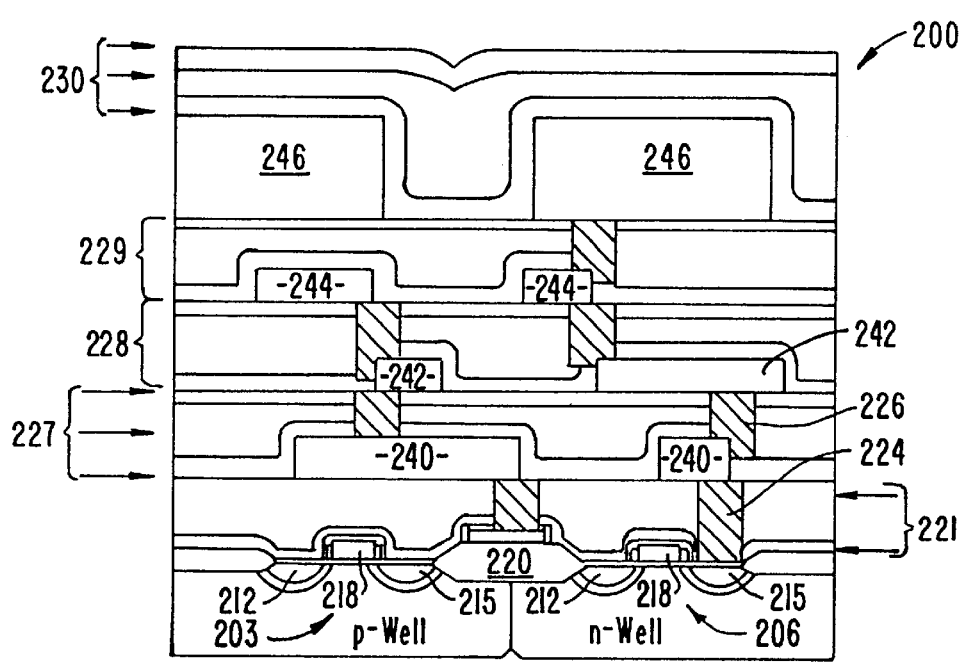
FIG. 2 is a simplified cross-sectional view of a semiconductor device manufactured according to the method of the present invention.

FIG. 2 illustrates a simplified cross-sectional view of an integrated circuit 200, which may be made in accordance with use of the present invention. As shown, integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by a groove trench isolation (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers, 240, 242, 244 and 246, included in integrated circuit 200. Each metal layer 240, 242, 244, and 246 is separated from adjacent metal layers by respective inter-metal dielectric (IMD) layers 227, 228, or 229. Adjacent metal layers are connected at selected openings by vias 226. Deposited over metal layer 246 are planarized passivation layers 230.

It should be understood that simplified integrated circuit 200 is for illustrative purposes only. One of ordinary skill in the art could implement use of the present invention in relation to fabrication of other integrated circuits such as nicroprocessors, application specific integrated circuits (ASICs), memory devices, and the like. Further, the present invention may be applied to PMOS, NMOS, CMOS, bipolar, or BiCMOS devices.

IV. Exemplary Barrier Layer deposition

Figure 3A:
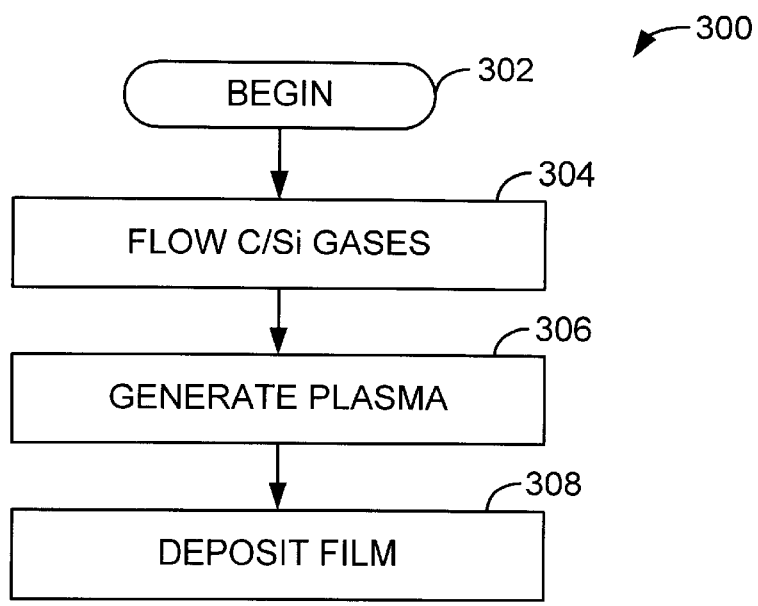
FIG. 3(a) is a flow diagram of a first embodiment of the method of the present invention.
Figure 3B:
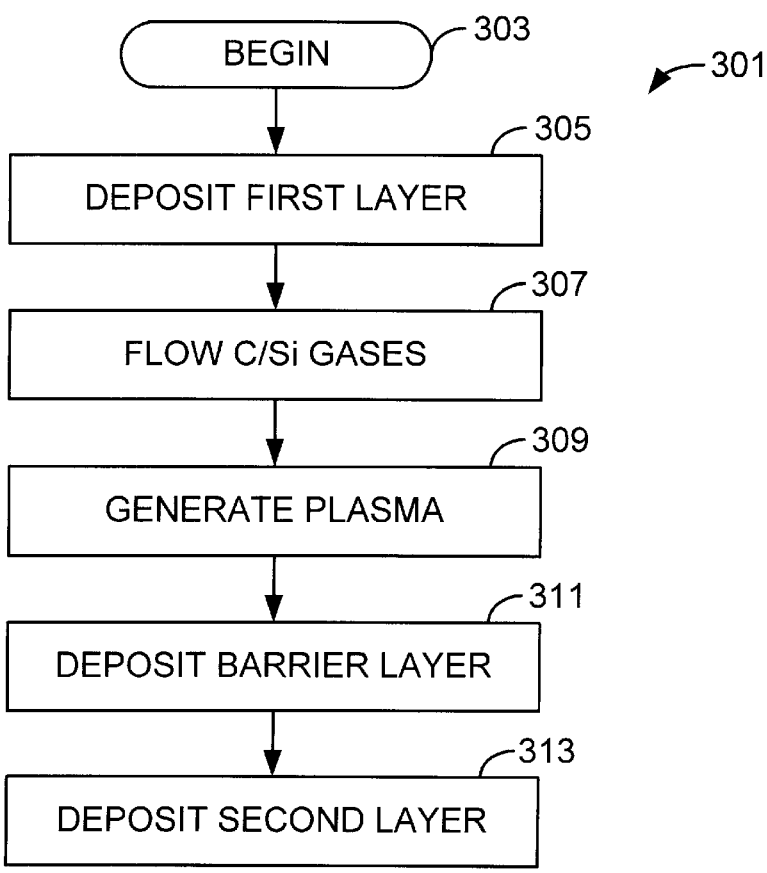
FIG. 3(b) is a flow diagram of a second embodiment of the method of the present invention.
Figure 4A:
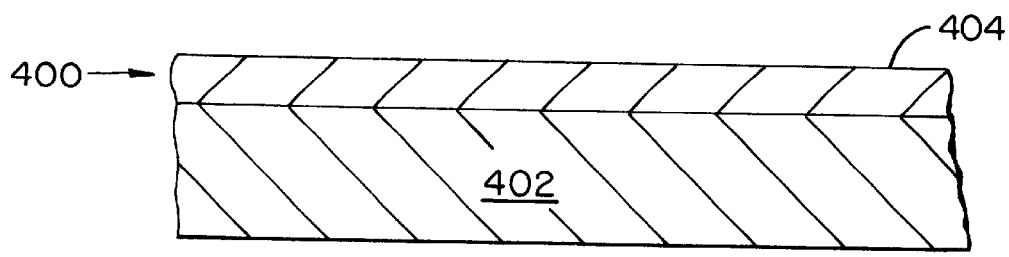
FIG. 4(a) is a cross-sectional view of an integrated stack deposited according to the first embodiment of the method of the present invention.
Figure 4B:
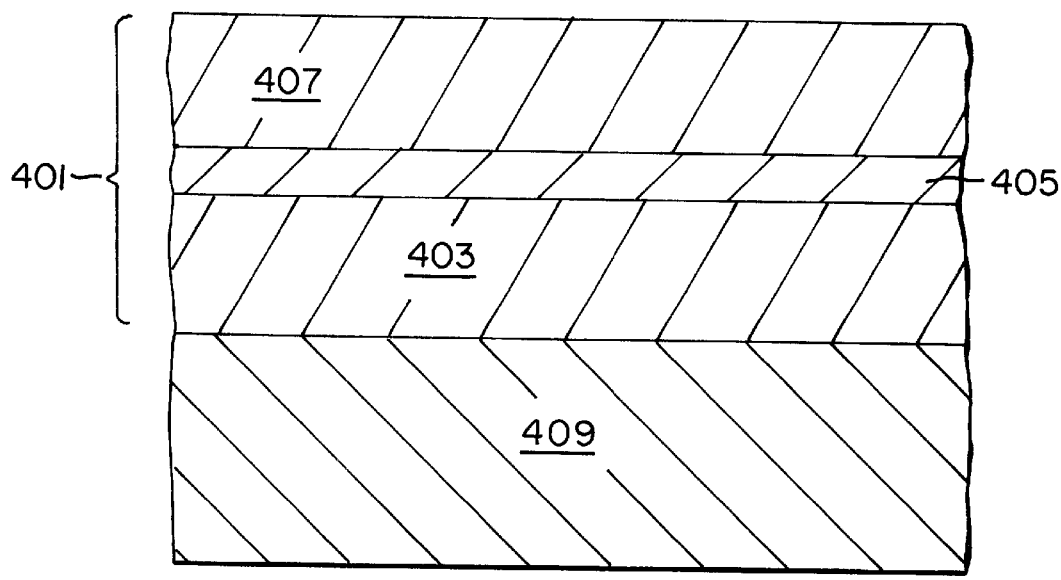
FIG. 4(b) is a cross-sectional view of an integrated stack deposited according to the second embodiment of the method of the present invention.

The present invention provides for deposition of a low dielectric constant that is particularly useful as a barrier layer. The method is best understood with reference to 3(a), 3(b), 4(a) and 4(b). FIGS. 3(a) and 3(b) depict a flow diagrams of first and second embodiments of the method of the present invention. FIGS. 4(a) and 4(b) represent alternative embodiments of integrated stacks deposited in accordance with the method embodied in FIGS. 3(a) and 3(b) respectively.

The first embodiment of the method is best understood by simultaneously referring to FIGS. 3(a) and 4(a). FIG. 3(a) depicts a flow diagram of a method 300 for depositing film 400 having a low-k barrier layer 404. The method 300 begins at 302. At step 304 a gaseous mixture containing flows of hydrocarbon-containing and silicon-containing gases is introduced to a process chamber such as chamber 13. Typically, the hydrocarbon is an alkane and the silicon-containing gas is a silane. The gaseous mixture may optionally include an inert gas. The chamber pressure is typically maintained at between 5 and 10 millitorr. The chamber wall temperature is typically maintained at between 120° C. and 160° C.

The desired properties of barrier layer 404, such as dielectric constant k, depend on the ratio of carbon to silicon atoms in the layer. As stated above, it is preferable to deposit a barrier layer 404 having an atomic ratio of carbon to silicon (C:Si ratio) of between about 55:45 and about 65:35. If the C:Si ratio in the barrier layer is too low the dielectric constant becomes unacceptably large, e.g., about 7.0 for a C:Si ratio of about 50:50. In addition, the leakage current of the barrier layer tends to increase as the C:Si ratio in the layer decreases. The C:Si atomic ratio in the layer depends in turn on the C:Si atomic ratio of the gaseous mixture. Generally, the C:Si ratio in the gaseous mixture is greater than 1:1, preferably between about 3:1 and about 8:1. Generally, for a given C:Si ratio in the gaseous mixture, the higher the substrate temperature the lower the C:Si ratio in the deposited layer. Therefore, relatively high C:Si ratios in the gaseous mixture may be desirable when depositing barrier layers at high substrate temperatures.

The carbon:silicon ratio in the gaseous mixture depends upon the hydrocarbon gas:silicon-containing gas flow rate ratio and the stoichiometry of the gases involved. Generally, for a hydrocarbon containing gas $C_xH_n$ provided at a flow rate A, and a silicon containing gas $Si_yH_m$ provided at a flow rate S, the carbon:silicon ratio is given by $$C:Si = Ax:Sy$$

In a specific embodiment, the alkane is methane ($CH_4$) and the silane is monosilane ($SiH_4$). An inert gas, such as Ar is also provided. If, for example, a C:Si ratio of about 1:1 is desired with $CH_4$ (x=1) and $SiH_4$ (y=1), the $CH_4$:$SiH_4$ flow rate ratio would be about 1:1. Alternatively, to obtain a C:Si ratio of about 1:1 with a gaseous mixture of ethane ($C_2H_6$, y=2), and $SiH_4$, the $C_2H_6$:$SiH_4$ flow rate ratio would be about 1:2. For the chamber depicted in FIG. 1A, flow rates for the deposition gases range from 10 to 30 standard cubic centimeters per minute (sccm) for $SiH_4$, from 60 to 100 sccm for $CH_4$, and from 0 to 100 sccm for Ar.

The gaseous mixture is energized at step 306 to form a plasma for depositing barrier layer 404 on a substrate 402 such as silicon. In a preferred embodiment, the plasma is a high-density plasma (HDP), i.e. a plasma having an ion density of approximately $10^{11}$ ions/cm$^3$ or greater. Alternatively, a lower density plasma, e.g. $10^8$–$10^9$ ions/cm$^3$, may be used in a PECVD process. The plasma may be energized by any suitable plasma generating system, e.g., source plasma system 80A and/or bias plasma system 80B of FIG. 1A. For example, in an HDP chamber such as chamber 13, between 1500 and 4800 watts of RF power are applied to top coil 29 and between 3000 and 4800 watts are applied to side coil 30.

Usually, only source RF power is used for plasma generation, film deposition, and substrate temperature control. Bias power is not normally used in the deposition process for two reasons. First, the plasma contains hydrogen that is readily dissociated from the alkane and silane gases and ionized in a plasma such as HDP. The resulting hydrogen ions could be energized by the wafer bias and energetically bombard the wafer. Sufficiently energetic bombardment could implant hydrogen into the wafer. Implantation of hydrogen into the wafer is not normally desirable since implanted hydrogen can easily diffuse into elements of the integrated circuit device structures formed on the substrate, e.g., gate region 218 of integrated circuit 200, and cause "hot carrier" degradation of the devices. Second, if argon is present in the plasma and the wafer is biased, Argon ions tend to energetically bombard the wafer. The energetic bombardment can sputter material from the wafer and the sputtered material tends to deposit on the walls of the chamber. Consequently, more frequent chamber cleaning is required for a bias process as opposed to a non-biased process. Argon sputtering also can break bonds, such as Si—C bonds, in the layer being deposited. The breaking of bonds tends to make the deposited layer more susceptible to moisture absorption.

The substrate temperature is typically maintained at between 350° and 450° C. during barrier layer deposition. Backside He cooling may optionally be used for process temperature control and targeting. Sometimes a low Bias RF power, e.g., up to 500 watts can be used for deposition temperature control using a closed loop with backside emissivity wafer temperature control. For example, epitaxial silicon (epi) wafers, have a relatively low resistivity, typically 0.01–0.02 Ω·cm for epi wafers compared to 1–80 Ω·cm for normal silicon wafers. Consequently, epi wafers cannot be heated with only source RF and a bias RF is necessary to help in heating up the wafer to the desired temperature. For example, a low bias power (up to 400 W for 200 mm wafers or ~1.3 W/cm$^2$) is sometimes used to heat-up an epi wafer to the desired temperature during the process. Such a level of power is sufficiently large to heat the wafer but sufficiently small that the aforementioned sputtering and hydrogen implantation problems are substantially diminished. By contrast, in a gap-fill application, where sputtering is desirable, the wafer bias can be as large as 3500 watts (~23 W/cm$^2$ for a 200 mm wafer) or larger.

A barrier layer like barrier layer 404 may be part of an integrated stack comprised of several layers of material as shown in FIG. 4(b). In an alternative embodiment, the barrier layer is deposited on top of a first dielectric layer. A second dielectric layer is subsequently deposited on top of barrier layer 404. The barrier layer need not be very thick compared to the overall film thickness. In an exemplary embodiment the barrier layer may amount to about 500–1000 Å out of a total film 400 approximately 10,000 Å thick. First and second dielectric layers can be deposited by any conventional means including plasma enhanced chemical vapor deposition (PECVD) and HDP-CVD. However, from a standpoint of process integration, it is more convenient to deposit all the layers in the same chamber used for the barrier layer deposition. Thus, if, for example, the barrier layer is deposited in an HDP-CVD chamber, it is convenient to deposit the first and second dielectric layers by HDP-CVD in the same chamber.

The method of FIG. 3(a) can be modified as shown in FIG. 3(b) to produce a multilayered integrated stack as shown in FIG. 4(b) according to the second embodiment of the present invention. The integrated stack 401 generally comprises a first layer of material 403, a barrier layer 405, and a second layer of material 407. Although, first and second layers 403 and 407 are described above as being layers of dielectric material, layers 403 and 407 may comprise any type of material including, dielectric materials, semiconducting materials, and metals. Layers 403 and 407 may be of the same type of material or different types depending on the specific application. Furthermore integrated stack 401 may include any number of different layers.

In an exemplary version of the second embodiment, stack 401 is deposited on a substrate 409 such as a semiconductor wafer. The second embodiment of the method 301 begins at 303. First FSG layer 403 layer is deposited on the substrate 409 at step 305. First material layer 403 may be deposited by conventional means including physical vapor deposition (PVD), chemical vapor deposition (CVD), sub-atmospheric CVD (SACVD), atmospheric pressure CVD (APCVD), plasma assisted CVD (PACVD), PECVD and HDP CVD. After depositing dielectric layer 403, a gaseous mixture containing flows of $CH_4$, $SiH_4$ and Ar is introduced to a process chamber containing substrate 409, at step 307. Flow rates for the deposition gases range from 60 to 100 sccm for $C_4$, from 10 to 30 sccm for $SiH_4$, and from 0 to 100 sccm for Ar.

The gaseous mixture is energized at step 309 to form a plasma for depositing barrier layer 405 over first dielectric layer 403. As in the first embodiment it is desirable, from a process integration standpoint, to deposit both dielectric layer 403 and barrier layer 405 in the same chamber. Preferably, the plasma is a high-density plasma (HDP). Source RF power, bias RF power, chamber pressure, chamber temperature and substrate temperature are generally maintained within the ranges set forth above with respect to the first embodiment. Barrier layer 405 need not be very thick compared to the overall desired thickness of stack 401. In one exemplary embodiment barrier layer 405 amounts to between about 500 to 1000 Å out of a stack 401 having a total thickness of approximately 10,000 Å. Following deposition of barrier layer 405, second dielectric layer 407 may optionally be deposited at step 311. Alternatively, a layer of metal, semiconducting material or other material may be deposited Although any conventional deposition technique may be used, it is desirable for reasons of process integration to deposit second dielectric layer 407 in the same chamber as first dielectric layer 403 and barrier layer 405. In the exemplary version of the second embodiment, first layer 403 and second layer 407 are layers of fluorinated silicate glass (FSG) deposited by HDP-CVD using $SiH_4$, silicon tetrafluoride ($SiF_4$), oxygen ($O_2$), and Ar.

V. Exemplary Damascene Process

The barrier layer and integrated stack deposition described above with respect to FIGS. 3(a)–4(b) may be utilized in a damascene process. A damascene structure may include, for example, as many as 10–12 low-k barrier layers of the type described above in IMD layers or as etch stop layers. An example of a dual-damascene process integration scheme that utilizes the low-k barrier layer deposition described above in forming an IMD layer is depicted in FIGS. 5(a)–5(h). The dual damascene process begins with the deposition of an oxide layer 502 over a silicon substrate 500 as shown in FIG. 5(a). A first Si—C—H low-k barrier layer 504, is deposited over oxide layer 502 using the alkane/silane deposition process described above, e.g., by HDP-CVD using $SiH_4$ and $CH_4$. In some applications layer 504 acts as a hardmask or etch-stop layer. A first FSG layer 506 is deposited and covered with a patterned photoresist layer 508 during a first photolithography as shown in FIG. 5(b). First FSG layer 506 may be deposited by in the same chamber as to enhance process integration. In FIG. 5(c), a first etch forms a first set of gaps 510 in first FSG layer 506 down to hardmask layer 504.

After the first etch, photoresist 508 is stripped, e.g., by ashing in an oxidizing environment. Gaps 510 and first FSG layer 506 are then covered with a layer of metal, such as:aluminum or copper. In the case of copper, a seed layer 512 (FIG. 5(c)) is deposited over gaps 510 and first FSG layer 506. A first bulk copper layer 514 is deposited to fill the gaps 510 as shown in FIG. 5(d). In some applications, a barrier layer (not shown) is deposited over first FSG layer 516 and gaps 510 prior to deposition of seed layer 512. The barrier layer prevents interdiffusion of copper and FSG. Copper layer 514 is planarized, e.g., by CMP. Planarization of copper layer 514 forms, e.g., a first set of metal lines 515 in an interconnect structure.

After planarization, of copper layer 514, a second barrier layer 516, a second FSG layer 518, a third barrier layer 520 and third FSG layer 522 are deposited to form an IMD layer 521 as shown in FIG. 5(e). Layers 518, 520, and 522 may be deposited in the same chamber, e.g., by HDP-CVD, to enhance process integration for forming IMD layer 521. A second lithography and etch forms vias 524 through layers 516, 518, 520 and 522 down to copper layer 514 as shown in FIG. 5(f). In FIG. 5(g), a third lithography and etch forms a second set of gaps 526. Gaps 526 define a second set of metal lines and vias 524 define a set of interconnects between the second set of metal lines and the first set of metal lines defined by gaps 510 and copper layer 514. Vias 524 and gaps 526 are then filled with a second bulk copper layer and the resulting structure is annealed and planarized as shown in FIG. 5(h). Gaps 526 define a second set of metal lines 528 and vias 524 define a set of interconnects 525 between the second set of metal lines 528 and the first set of metal lines 515.

Damascene processes are used in devices that use copper interconnects because there is currently no acceptable way to etch copper. Structures formed by damascene processes do not require a gap-fill dielectric and generally provide lower RC delays than similar structures formed using metal lines aluminum, tungsten, titanium or other metals. Furthermore, higher deposition rates may be used in damascene processes since gap-fill is not an issue. Any of barrier layers 506, 516 and 520 can be deposited using the alkane silane barrier layer deposition described above with respect to FIGS. 2, 3(a), 3(b), 4(a) and 4(b). Alternatively, it may be desirable to deposit one or more of barrier layers 506, 516 and 520 as silicon nitride layers. This may be advantageous-from a process integration standpoint since, like the FSG and barrier layers, silicon nitride can be deposited by HDP-CVD.

VI. Experimental Results

Experimental results have demonstrated that it is possible to achieve a low-k barrier layer using HDP-CVD with $CH_4$ and $SiH_4$ according to the method described above. Barrier layer thickness ranged from about 500 Å to about 1000 Å. The low-k barrier layers were deposited over four different types of dielectric layers as follows:

1) FSG deposited by HDP-CVD;
2) FSG deposited by PECVD using TEOS;
3) USG deposited by HDP-CVD; and
4) USG deposited by PECVD using TEOS.

Figure 6:
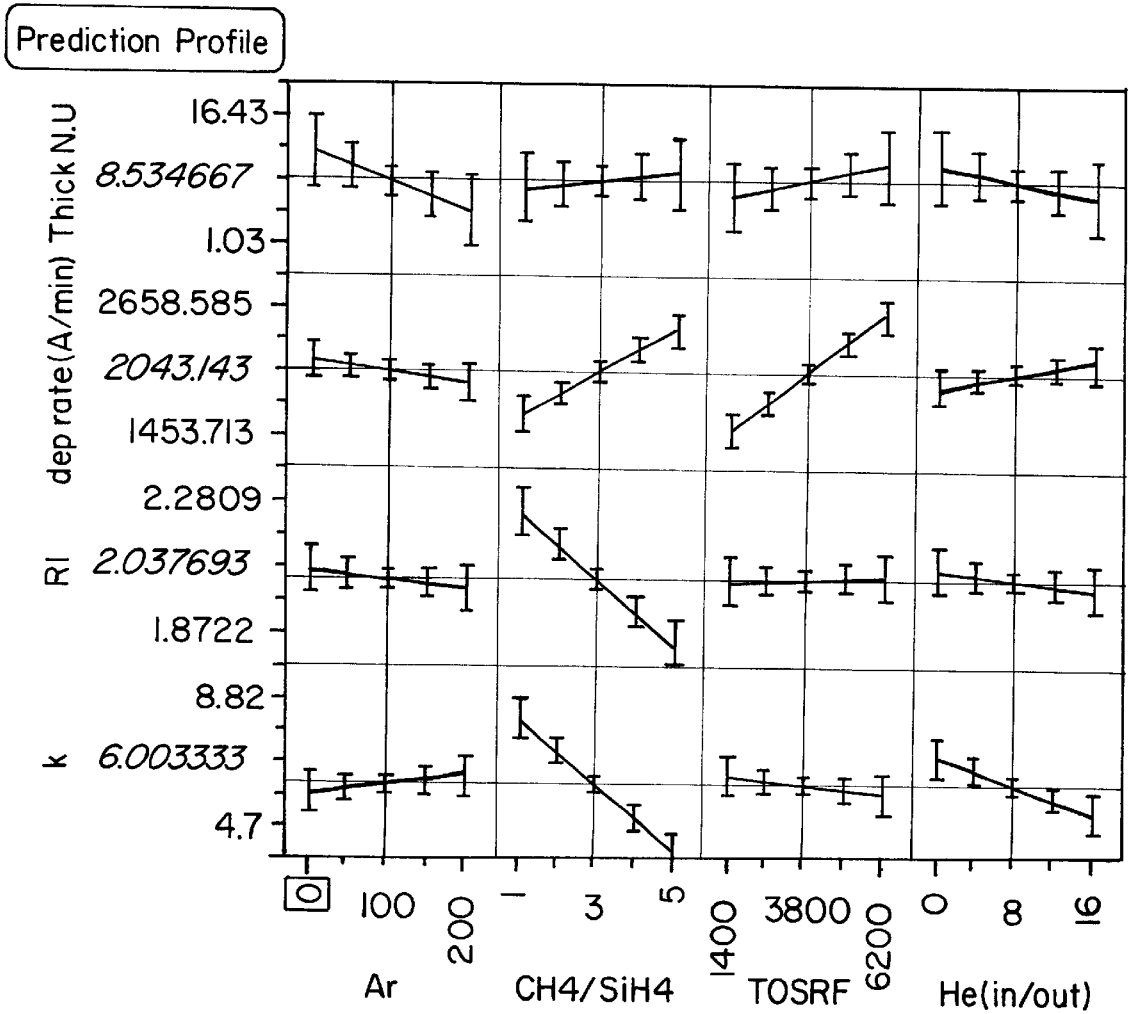
FIG. 6 depicts combined graphs illustrating the design of experiments for embodiments of the method of the present invention.
Figure 7:
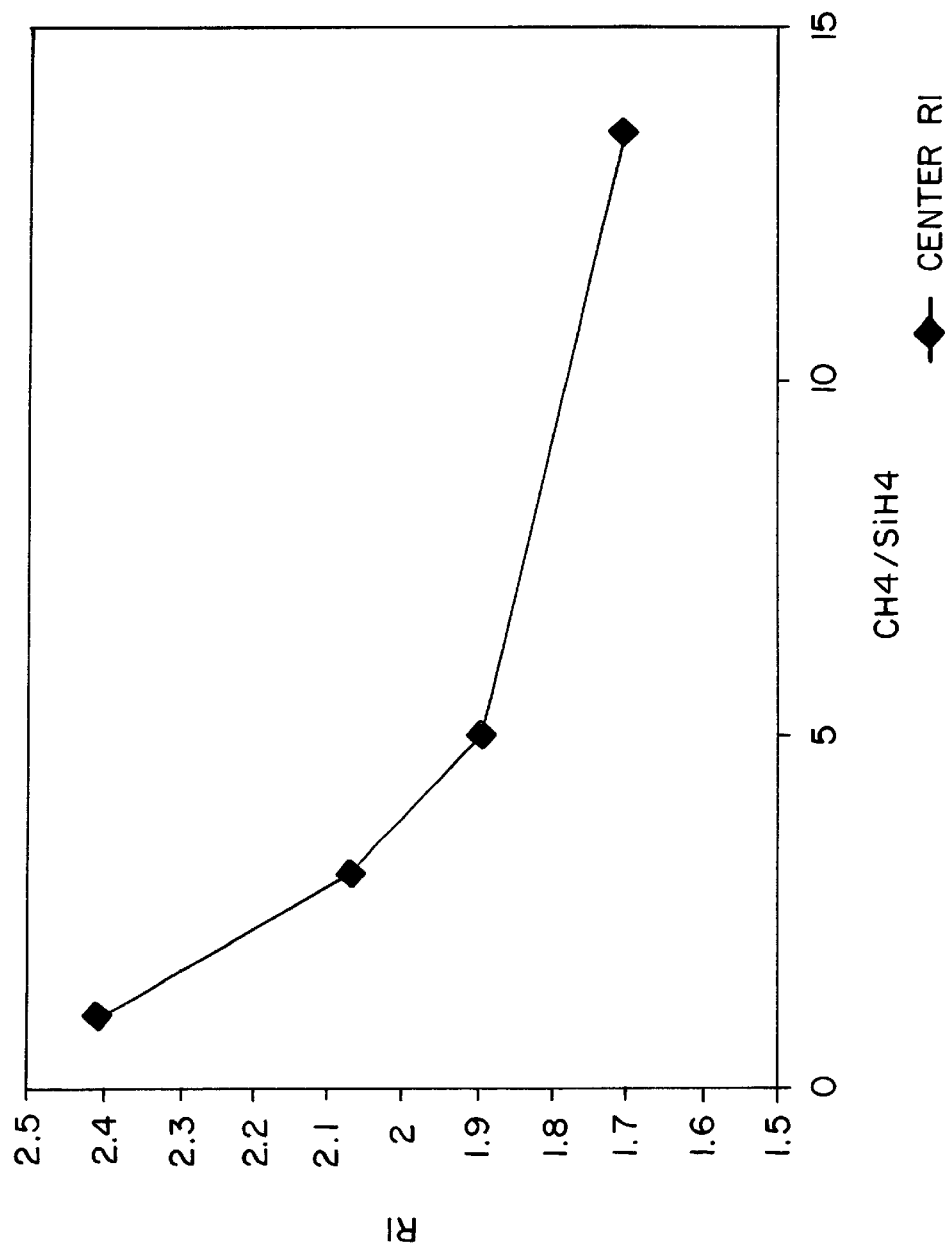
FIG. 7 depicts a graph of refractive index as a function of $CH_4/SiH_4$ ratio for films deposited according to embodiments of the present invention.

Sample barrier layers were deposited on 200 mm silicon and epi wafers in an Ultima chamber manufactured by Applied Materials. The design of experiments for barrier layer deposition are summarized in FIG. 6. FIG. 6 depicts combined graphs that plot thickness non-uniformity, deposition rate, refractive index (RI) and dielectric constant as functions of Argon flow rate, $CH_4/SiH_4$ ratio, top source RF (TOSRF), and the ratio of inside to outside Helium pressure in a dual zone system (He(in/out)). Note that the k-value, RI and deposition rate all depend strongly on the $CH_4/SiH_4$ ratio. Generally, k-value and RI increase with higher $CH_4/SiH_4$ ratio, while the deposition rate decreases. FIG. 7 depicts a more detailed graph of RI as a function of $CH_4/SiH_4$ ratio. The RI value drops sharply as the $CH_4/SiH_4$ ratio increases above about 1. Above a $CH_4/SiH_4$ ratio of about 5, the decline in RI is noticeably less steep. The results of these experiments show that barrier layers having k-values between about 4.1 to 4.3 and RI values of about 1.7 to 1.8 can be achieved using embodiments of the method of the present invention.

Adhesion of HDP-CVD low-k barrier layers was tested by repeated thermal annealing of the wafers containing the barrier layers. Each wafer was heated to about 410° C. for a heating cycle of roughly 30 minutes. Six such heating cycles were performed for each wafer. Visual inspection of all the wafers revealed no delamination or bubbles. Closer inspection of the wafers under a confocal microscope also showed no bubbles or delamination.

Having fully described several embodiments of the present invention, many other equivalent or alternative methods of depositing the low dielectric constant oxide layer according to the present invention will be apparent to those skilled in the art. These alternatives and equivalents are intended to be included within the scope of the present invention.

What is claimed is:

1. A method for depositing a barrier layer over a substrate disposed in a process chamber, the method comprising:
   (a) flowing a gaseous mixture comprising a silicon containing gas, and a hydrocarbon containing gas to the chamber, wherein the gaseous mixture has a carbon:silicon ratio less than 8:1 and greater than 1:1;
   (b) generating a plasma from said gaseous mixture; and
   (c) depositing the barrier layer over the substrate with a dielectric layer to form an intermetal dielectric layer in a damascene structure,
   wherein the barrier layer includes silicon (Si), carbon (C), and hydrogen (H), and said hydrogen is incorporated into the barrier layer in a concentration of about 50 atomic percent or less.

2. The method of claim 1 wherein said plasma is a high-density plasma.

3. The method of claim 1 wherein said silicon containing gas includes a silane.

4. The method of claim 3 wherein said silane is monosilane ($SiH_4$), disilane ($Si_2H_6$), trisilane ($Si_3H_8$), or tetrasilane ($Si_4H_{10}$).

5. The method of claim 1 wherein said hydrocarbon containing gas includes an alkane.

6. The method of claim 3 wherein said alkane is methane, ethane, butane, propane, pentane or hexane.

7. The method of claim 1 wherein the gaseous mixture consists essentially of one or more hydrocarbon gases, a silicon containing gas and an inert gas.

8. The method of claim 1 wherein said carbon:silicon ratio is between about 3:1 and about 8:1.

9. The method of claim 1 wherein said carbon and said silicon are incorporated into the barrier layer in a C/Si atomic ratio of between about 55/45 and about 65/35.

10. The method of claim 1 wherein said barrier layer has a dielectric constant of about 4.5 or less.

11. The method of claim 1 wherein said barrier layer has a thickness of between about 500 Å and 1000 Å.

12. The method of claim 1 wherein said barrier layer is deposited on the dielectric layer on the substrate, said dielectric layer having a dielectric constant of about 3.5 or less.

13. The method of claim 1 further comprising, depositing the dielectric layer of material over said barrier layer, said dielectric layer having a dielectric constant of about 3.5 or less.

14. The method recited in claim 1 wherein the dielectric layer comprises a fluorinated silicate glass layer.

15. A method for depositing a barrier layer on a substrate in a process chamber, comprising:

(a) flowing a gaseous mixture containing flows of silane ($SiH_4$) and methane ($CH_4$) into the chamber, wherein said flows of silane and methane have a methane:silane flow rate ratio less than 8:1 and greater than 1:1;

(b) generating a high-density plasma from said gaseous mixture; and (c) depositing the barrier layer with a dielectric layer onto the substrate using said plasma,
wherein the barrier layer includes silicon (Si), carbon (C), and hydrogen (H), and said hydrogen is incorporated into barrier layer in a concentration of about 50 atomic percent or less.

16. The method of claim 15 wherein said methane:silane flow rate ratio is between about 3:1 and 8:1.

17. The method of claim 16 wherein said gaseous mixture further includes a flow of argon (Ar).

18. The method of claim 15 wherein said barrier layer has a dielectric constant of about 4.5 or less.

19. The method recited in claim 15 wherein the dielectric layer comprises a fluorinated silicate glass layer.

20. A computer readable storage medium having a computer-readable program embodied therein for directing operation of a substrate processing system including a process chamber; a plasma generation system; a substrate holder; a gas delivery system configured to introduce gases into the process chamber, the computer-readable program including instructions for operating the substrate processing system to form a substrate disposed in the processing chamber in accordance with the following:

(a) flowing a gaseous mixture containing flows of a silicon containing gas, and a hydrocarbon containing gas into the chamber, wherein the gaseous mixture has a carbon:silicon ratio less than 8:1 and greater than 1:1;

(b) generating a plasma from said gaseous mixture; and (c) depositing the barrier layer over the substrate with a dielectric layer to form an intermetal dielectric layer in a damascene structure;
wherein the barrier layer includes silicon (Si), carbon (C), and hydrogen (H), and said hydrogen is incorporated into the barrier layer in a concentration of about 50 atomic percent or less.

21. A substrate processing system comprising:

a housing defining a process chamber;

a plasma generating system coupled to said processing chamber;

a substrate holder, configured to hold a substrate during substrate processing;

a gas delivery system configured to introduce gases into said process chamber;

a controller for controlling said gas delivery system and said plasma generating system; and a memory coupled to said controller comprising a computer-readable medium having a computer-readable program embodied therein for directing operation of said substrate processing system, said computer-readable program including (a) a first set of instructions directing said gas delivery system to flow a gaseous mixture containing flows of a silicon containing gas, and a hydrocarbon containing gas into the process chamber, wherein the gaseous mixture has a carbon:silicon ratio less than 8:1 and greater than 1:1; and (b) a second set of instructions directing the plasma generating system to generate a plasma from said gaseous mixture to deposit the barrier layer over the substrate with a dielectric layer to form an intermetal dielectric layer in a damascene structure,
wherein the barrier layer includes silicon (Si), carbon (C), and hydrogen (H), and said hydrogen is incorporated into the barrier layer in a concentration of about 50 atomic percent or less.

22. A method for depositing a barrier layer over a substrate disposed in a process chamber, the method comprising:

(a) flowing a gaseous mixture consisting essentially of a silicon containing gas and a hydrocarbon containing gas to the chamber, wherein the gaseous mixture has a carbon:silicon ratio less than 8:1 and greater than 1:1; and (b) generating a plasma from said gaseous mixture and using said plasma to deposit the barrier layer over the substrate with a dielectric layer to form an intermetal dielectric layer in a damascene structure,
wherein the barrier layer includes silicon (Si), carbon (C), and hydrogen (H), and said hydrogen is incorporated into the baffler layer in a concentration of about 50 atomic percent or less.

23. The method of claim 22 wherein said carbon and said silicon are incorporated into the barrier layer in a C/Si atomic ratio of between about 55/45 and about 65/35.

24. The method of claim 22 wherein said hydrogen is incorporated into the barrier layer in a concentration of about 50 atomic percent or less.

25. The method recited in claim 22 wherein the dielectric layer comprises a fluorinated silicate glass layer.

* * * * *